(12) United States Patent
Maruoka

(10) Patent No.: US 11,269,016 B2
(45) Date of Patent: Mar. 8, 2022

(54) USB TEST DEVICE AND USB POWER RECEPTION DEVICE

(71) Applicant: Renesas Electronics Corporation, Tokyo (JP)

(72) Inventor: Hiroki Maruoka, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 274 days.

(21) Appl. No.: 15/878,511

(22) Filed: Jan. 24, 2018

(65) Prior Publication Data

US 2018/0306870 A1 Oct. 25, 2018

(30) Foreign Application Priority Data

Apr. 25, 2017 (JP) .............................. JP2017-086449

(51) Int. Cl.
*G01R 31/40* (2020.01)
*G06F 1/26* (2006.01)
*G06F 13/00* (2006.01)

(52) U.S. Cl.
CPC ............. *G01R 31/40* (2013.01); *G06F 1/266* (2013.01); *G06F 13/00* (2013.01)

(58) Field of Classification Search
CPC combination set(s) only.
See application file for complete search history.

(56) References Cited

U.S. PATENT DOCUMENTS

2010/0275001 A1* 10/2010 Yoshioka ................ G06F 1/266
713/2
2010/0281187 A1* 11/2010 Kim ...................... G06F 13/385
710/15
2012/0297207 A1* 11/2012 Carlsen ............... G06F 13/4081
713/300

FOREIGN PATENT DOCUMENTS

JP      2016-201909 A    12/2016
JP      2016-207139 A    12/2016
JP       2016201909 A  * 12/2016

OTHER PUBLICATIONS

Universal Serial Bus Type-C Cable and Connector Specification Rev. 1.2, Mar. 25, 2016.
Universal Serial Bus Power Delivery Specification Rev. 3.0 Ver. 1.1/Rev. 2.0 Ver. 1.3, Jan. 12, 2017.
Japanese Office Action dated Jun. 23, 2020, in Japanese Patent Application No. 2017-086449 with an English translation.

(Continued)

*Primary Examiner* — Lee E Rodak
*Assistant Examiner* — Brent J Andrews
(74) *Attorney, Agent, or Firm* — McGinn IP Law Group, PLLC

(57) ABSTRACT

A USB test device for testing a power feed device having a USB plug includes: a connector connected to the USB plug; a communication control unit that communicates with the power feed device through a communication line of the connector; a load control unit capable of controlling a load of a power supply line of the connector receiving power supply from the power feed device; a test control unit that gives an instruction to the load control unit based on power supply information which was obtained by the communication control unit and which is about a combination of electric power that can be supplied from the power feed device, and examines a state of power supply to the load from the power feed device; and a display unit that displays a result of examination by the test control unit.

20 Claims, 14 Drawing Sheets

(56) References Cited

OTHER PUBLICATIONS

Taiwanese Office Action, dated Jun. 8, 2021, in Taiwanese Application No. 107103928 and English Translation thereof.
Taiwanese Office Action, dated Nov. 8, 2021, in Taiwanese Application No. 107103928 and English Translation thereof.

* cited by examiner

FIG.7

| POWER SUPPLY LIST | | |
|---|---|---|
| ID0 | 20V | 5A |
| ID1 | 15V | 5A |
| ID2 | 10V | 3A |
| ID3 | 5V | 3A |

FIG.10A

| POWER SUPPLY LIST | | |
|---|---|---|
| ID0 | 20V | 5A |
| ID1 | 15V | 5A |
| ID2 | 10V | 3A |
| ID3 | 5V | 3A |

FIG.10B

| POWER SUPPLY LIST | | |
|---|---|---|
| ID1 | 15V | 5A |
| ID2 | 10V | 3A |
| ID3 | 5V | 3A |

FIG.10C

| POWER SUPPLY LIST | | |
|---|---|---|
| ID2 | 10V | 3A |
| ID3 | 5V | 3A |

FIG.10D

| POWER SUPPLY LIST | | |
|---|---|---|
| ID3 | 5V | 3A |

USB TEST DEVICE AND USB POWER RECEPTION DEVICE

This nonprovisional application is based on Japanese Patent Application No. 2017-086449 filed on Apr. 25, 2017 with the Japan Patent Office, the entire contents of which are hereby incorporated by reference.

BACKGROUND OF THE INVENTION

Field of the Invention

The present disclosure relates to a universal serial bus (USB) test device for testing a USB device.

Description of the Background Art

A configuration in which electric power is supplied from a USB device to another USB device (also referred to as USB power feed) has conventionally been known.

In this regard, recent years have seen the introduction of a USB connector featuring a reversible plug orientation. USB Type-C and the like having a shape that allows insertion in either direction are known (Universal Serial Bus Type-C Cable and Connector Specification Rev. 1.2).

An output voltage supplied to a conventional USB device has been fixed (by way of example, 5 V). However, since requested electric power is different for each piece of equipment, an output voltage on a power feed side should be variable instead of being fixed, and schemes capable of feeding power at a high voltage (USB Power Delivery) have been proposed (Universal Serial Bus Power Delivery Specification Rev. 3.0 Ver. 1.1/Rev. 2.0 Ver. 1.3).

SUMMARY OF THE INVENTION

A higher level of safety is required for higher-voltage power feed, and there exists a need for a user to be able to easily test and verify the quality of a USB device.

The present disclosure was made to solve the problems above, and an object is to provide a USB test device capable of easily verifying the quality of a USB device, and a USB power reception device.

Other objects and novel features will become apparent from the description herein and the accompanying drawings.

According to one embodiment, a USB test device for testing a power feed device having a USB plug includes: a connector connected to the USB plug; a communication control unit that communicates with the power feed device through a communication line of the connector; a load control unit capable of controlling a load of a power supply line of the connector receiving power supply from the power feed device; a test control unit that gives an instruction to the load control unit based on power supply information which was obtained by the communication control unit and which is about a combination of electric power that can be supplied from the power feed device, and examines a state of power supply to the load from the power feed device; and a display unit that displays a result of examination by the test control unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram illustrating a power supply list based on the first embodiment.

FIGS. 10A to 10D are diagrams illustrating power supply lists based on the second embodiment.

DESCRIPTION OF THE PREFERRED EMBODIMENTS

Figure 1:
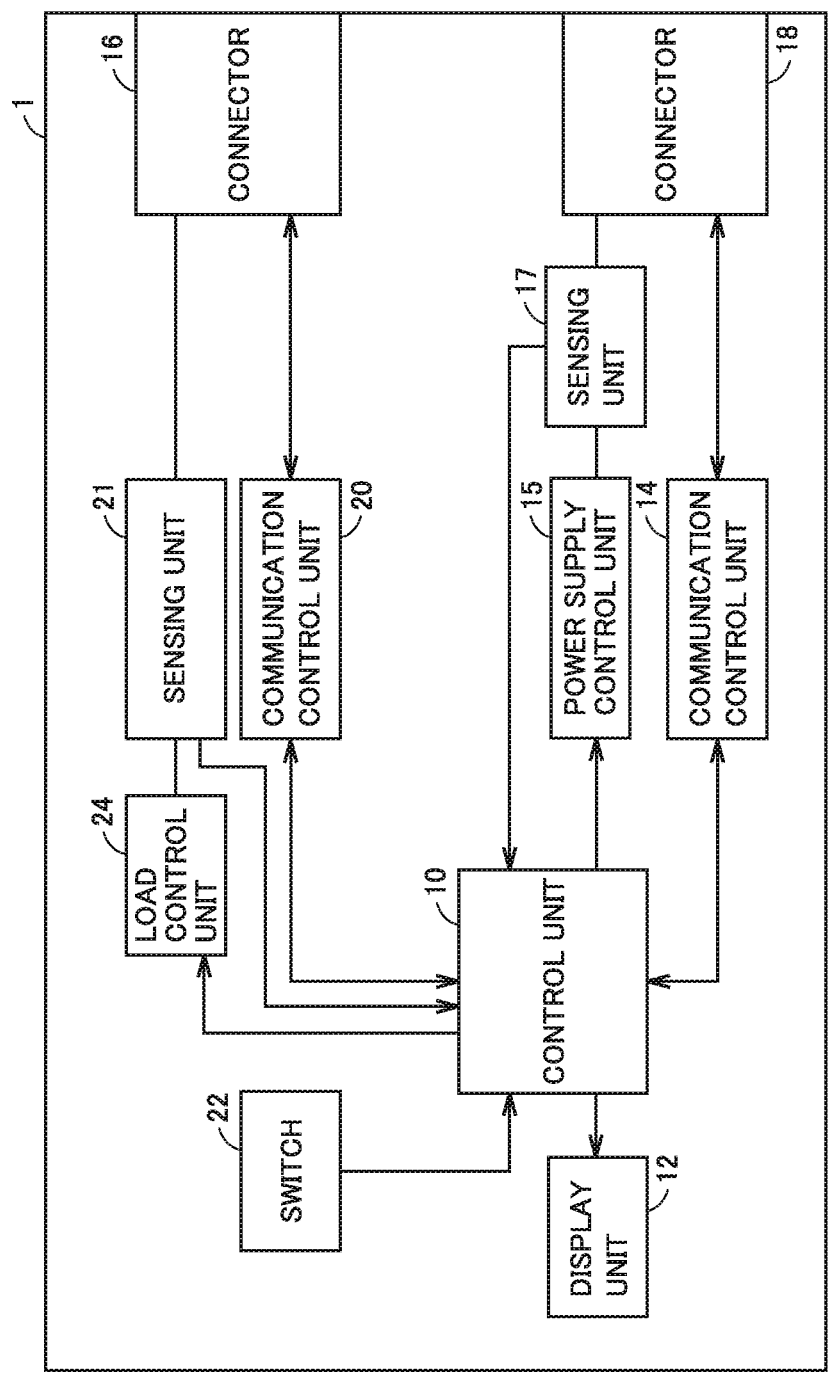
FIG. 1 is a diagram illustrating a configuration of a USB test device 1 based on a first embodiment.

Embodiments will be described in detail with reference to the drawings. The same or corresponding parts are denoted by the same symbols in the drawings, and description thereof will not be repeated.

First Embodiment

<A. Overall Configuration>
<a1. Overview of USB Test Device 1>

FIG. 1 is a diagram illustrating a configuration of a USB test device 1 based on a first embodiment.

Referring to FIG. 1, USB test device 1 includes a plurality of connectors 16 and 18 each provided to be able to connect to a USB device, and a plurality of communication control units 20 and 14 provided in correspondence with connectors 16 and 18, respectively. USB test device 1 includes a power supply control unit 15, a load control unit 24 provided in correspondence with connector 16, sensing units 17 and 21 that sense a voltage and a current supplied to a power supply line VBUS, a control unit 10 that controls the entire USB test device 1, a switch 22, and a display unit 12.

Connectors 16 and 18 are each provided to be able to connect to a USB device. In this example, connector 16 is connected to a USB device (power feed device). Connector 18 is connected to a USB device (power reception device).

Communication control units 20 and 14 are provided to be able to communicate with the USB devices through signal lines connected to connectors 16 and 18, respectively.

In accordance with an instruction from control unit 10, power supply control unit 15 supplies power necessary for power supply line VBUS connected to connector 18.

Load control unit 24 controls a loaded condition of power supply line VBUS connected to connector 16.

Switch 22 is a switch that indicates execution of test operation in USB test device 1. In accordance with this indication given by depression of switch 22, the test operation in USB test device 1 is performed.

Display unit 12 is connected to control unit 10, and displays a test result of the test operation.

<a2. Overview of Test of USB Test Device 1>

Figure 2:
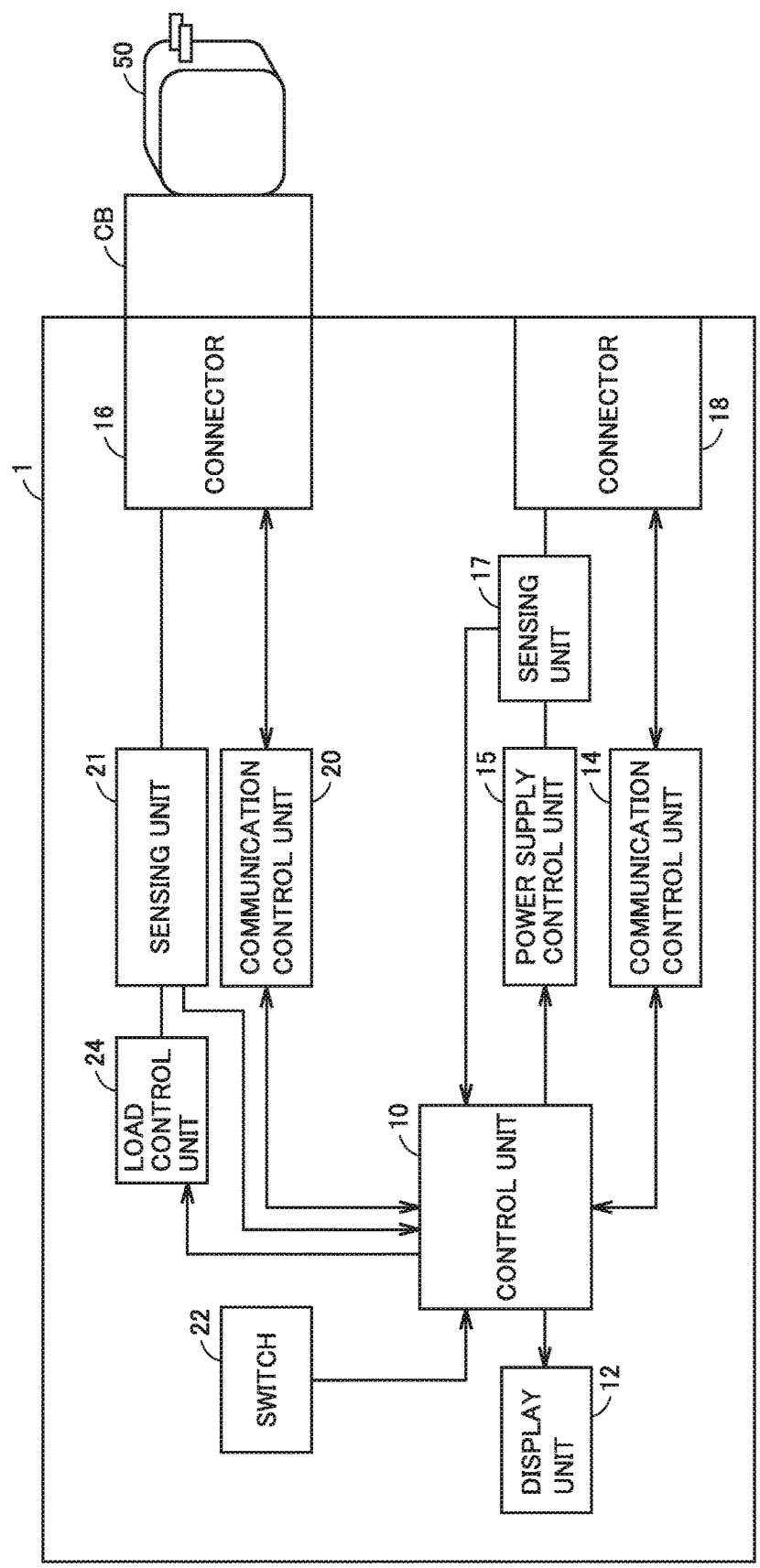
FIG. 2 is a diagram illustrating a configuration of a USB device connected to USB test device 1 based on the first embodiment.

FIG. 2 is a diagram illustrating a configuration of a USB device connected to USB test device 1 based on the first embodiment.

Referring to FIG. 2, USB test device 1 and a USB device (power feed device) 50 are shown as connected by way of example. Specifically, USB device (power feed device) 50 has a USB plug CB. USB plug CB of USB device (power feed device) 50 is inserted into and connected to connector 16.

USB device (power feed device) 50 has the function of USBPD (USB Power Delivery) capable of feeding power at a high voltage, and is provided to be able to feed various types of power in response to requests from the power reception side.

<a3. Circuit Configuration of Connector 16 of USB Test Device 1>

Figure 3:
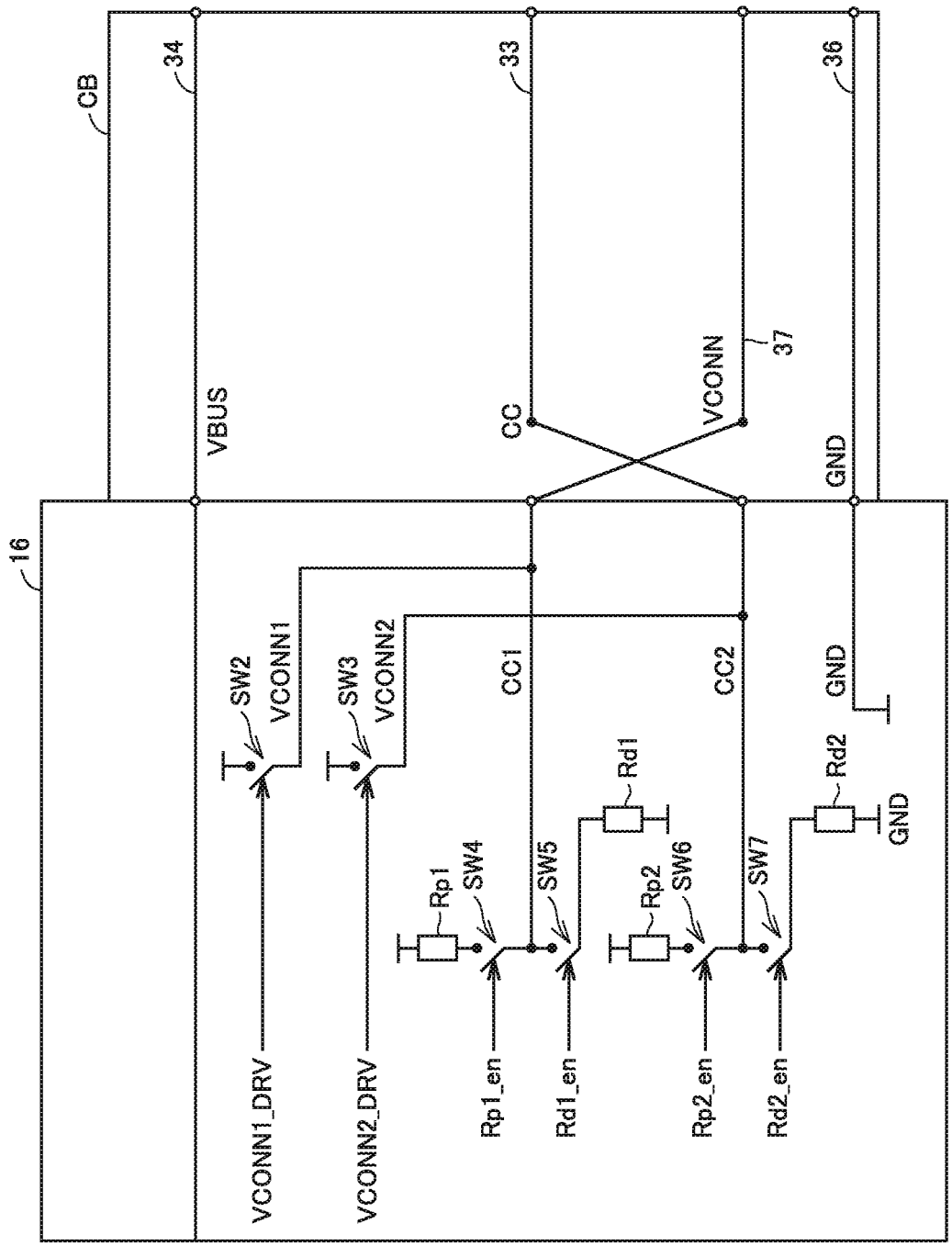
FIG. 3 is a diagram illustrating a circuit configuration of a connector 16 based on the first embodiment.

FIG. 3 is a diagram illustrating a circuit configuration of connector 16 based on the first embodiment.

Referring to FIG. 3, connector 16 includes switches SW2 to SW7 (hereinafter also referred to as switch SW), resistors Rp1, Rp2, and resistors Rd1, Rd2. Resistors Rp1, Rp2 and resistors Rd1, Rd2 may be externally provided.

Switches SW2 and SW3 are switches for supplying power to a plug power supply line 37 (line VCONN). Switch SW2 is provided between a line VCONN1 and a power supply, and is brought into/out of conduction in accordance with a control signal VCONN1_DRV. Switch SW3 is provided between a line VCONN2 and the power supply, and is brought into/out of conduction in accordance with a control signal VCONN2_DRV.

Switch SW4 is provided in series with resistor Rp1 between the power supply and a line CC1, and is brought into/out of conduction in accordance with a control signal Rp1_en.

Switch SW5 is provided in series with resistor Rd1 between line CC1 and a ground voltage, and is brought into/out of conduction in accordance with a control signal Rd1_en.

Switch SW6 is provided in series with resistor Rp2 between the power supply and a line CC2, and is brought into/out of conduction in accordance with a control signal Rp2_en.

Switch SW7 is provided in series with resistor Rd2 between line CC2 and the ground voltage, and is brought into/out of conduction in accordance with a control signal Rd2_en.

Control signals for controlling switches SW2 to SW7 are output from communication control unit 20.

One of line CC1 and line CC2 is connected to a port configuration line 33 (line CC), and the other is connected to plug power supply line 37.

Port configuration line 33 is a communication line through which communication processing is performed.

Plug power supply line 37 is used for a power supply of a communication chip that conducts communication through port configuration line 33.

Connector 16 is provided to be able to connect to either a front surface or a rear surface of plug CB.

When connector 16 and the front surface of plug CB are connected, line CC1 and plug power supply line 37 are connected. Line CC2 and port configuration line 33 are also connected.

When connector 16 and the rear surface of plug CB are connected, line CC1 and port configuration line 33 are connected. Line CC2 and plug power supply line 37 are also connected.

It can be determined whether connector 16 is connected to the front surface or the rear surface of plug CB in accordance with switching of switch SW.

Figure 4:
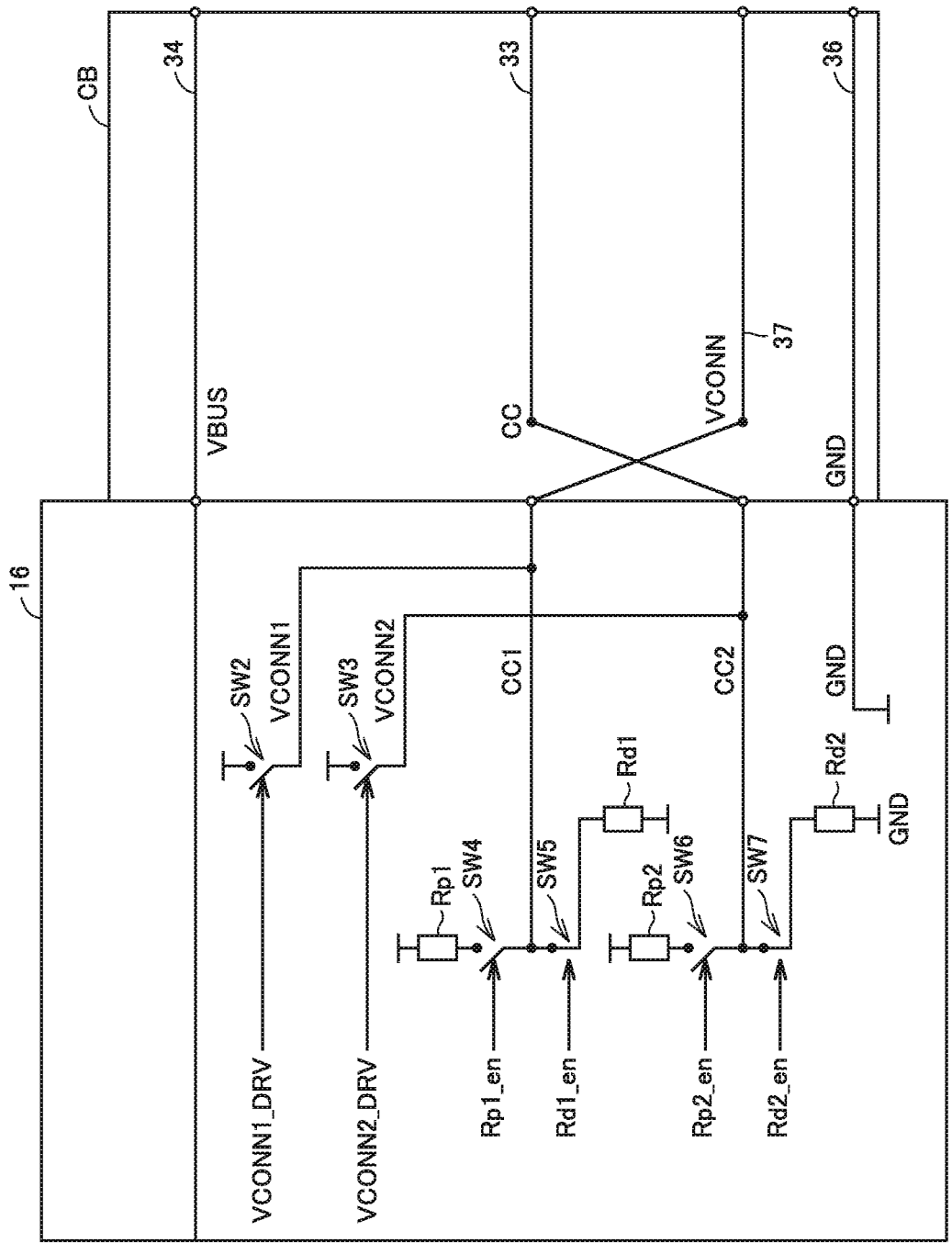
FIG. 4 is a diagram illustrating a configuration of connector 16 when resistors Rd are connected based on the first embodiment.

FIG. 4 is a diagram illustrating a configuration of connector 16 when resistors Rd are connected based on the first embodiment.

As shown in FIG. 4, communication control unit 20 inputs control signals Rd1_en and Rd2_en ("H" level by way of example) to bring switches SW into conduction.

Accordingly, line CC1 and line CC2 are connected to a ground voltage GND through resistors Rd1 and Rd2, respectively.

Line CC1 is connected to plug power supply line 37.

Line CC2 is connected to port configuration line 33.

USB device (power feed device) 50 detects a voltage level of plug power supply line 37.

Specifically, plug power supply line 37 is connected to a power supply voltage VDD through a resistor Ra which is not shown.

Thus, when plug power supply line 37 is connected to line CC1, and line CC1 is connected to resistor Rd1, then plug power supply line 37 has an intermediate voltage in accordance with resistance division of resistor Rp and resistor Ra.

When it is detected that plug power supply line 37 has the intermediate voltage, USB device (power feed device) 50 determines that USB device (power feed device) 50 has been connected to a USB device (power reception device).

When it is determined that USB device (power feed device) 50 has been connected to a USB device (power reception device), USB device (power feed device) 50 supplies a voltage (5 V) to power supply line VBUS.

Although the description has been provided with respect to connector 16 in this example, a connection between plug CB and line CC is also detected in accordance with a similar scheme for connector 18.

<B. Test Method>

<b1. Cold Socket Compatibility Test>

A cold socket compatibility test is a test of checking whether or not a USB device (power feed device) sets power supply line VBUS to 5 V/0 V in accordance with sensing of connection/non-connection to a USB device (power reception device).

A cold socket-compatible USB device (power feed device), when not connected to a USB device (power reception device), sets power supply line VBUS to 0 V, thereby allowing a connection between the devices to be established safely.

A cold socket-incompatible USB device (power feed device) sets power supply line VBUS to a prescribed voltage. Thus, consideration must be given to safety issues such as an equipment failure due to a connection between the devices, or burning due to heated equipment.

Figure 5:
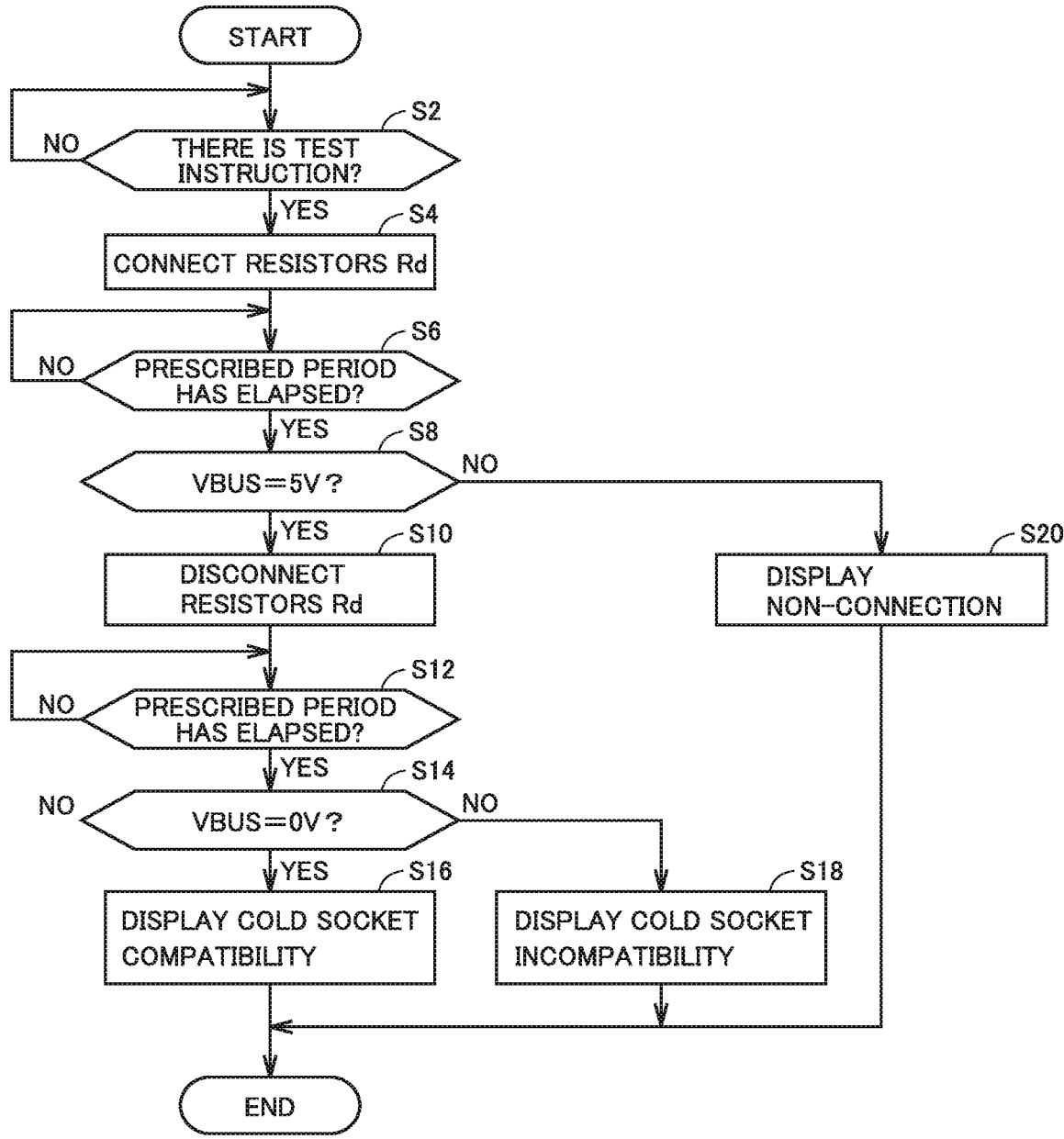
FIG. 5 is a flow diagram illustrating a cold socket compatibility test of USB test device 1 based on the first embodiment.

FIG. 5 is a flow diagram illustrating the cold socket compatibility test of USB test device 1 based on the first embodiment.

Referring to FIG. 5, USB test device 1 determines whether or not there is a test instruction (step S2). Specifically, control unit 10 determines whether or not there is an instruction by operation of switch 22.

When it is determined in step S2 that there is a test instruction (YES in step S2), USB test device 1 connects resistors Rd (step S4). Specifically, control unit 10 instructs communication control unit 20 to set line CC of connector 16 in the connected state described in FIG. 4.

As described above, when it is detected that plug power supply line 37 has the intermediate voltage, USB device (power feed device) 50 determines that USB device (power feed device) 50 has been connected to a USB device (power reception device). USB device (power feed device) 50 thus supplies a voltage (5 V) to power supply line VBUS upon determining that USB device (power feed device) 50 has been connected to a USB device (power reception device).

Next, USB test device 1 determines whether or not a prescribed period has elapsed (step S6).

USB test device 1 maintains the state of step S6 until after the prescribed period has elapsed, and when it is determined in step S6 that the prescribed period has elapsed (YES in step S6), USB test device 1 determines whether or not power supply line VBUS has 5 V (step S8). Specifically, control unit 10 determines whether or not the voltage of power supply line VBUS is 5 V as a result of sensing by sensing unit 21. By way of example, the prescribed period can be set to 275 ms.

When it is determined in step S8 that power supply line VBUS does not have 5 V (NO in step S8), USB test device 1 displays non-connection (step S20).

Specifically, when it is determined that the voltage of power supply line VBUS is not 5 V as a result of sensing by sensing unit 21, control unit 10 instructs display unit 12 to display non-connection. Display unit 12 thus displays non-connection.

Then, the process ends (END).

When USB device (power feed device) 50 is not connected to a USB device (power reception device), USB test device 1 can display this state to notify a user of the state.

When this state is displayed although USB device (power feed device) 50 is being connected to a USB device (power reception device), USB test device 1 can notify the user of a malfunction of USB device (power feed device) 50 or a poor connection.

When it is determined in step S8 that power supply line VBUS has 5 V (YES in step S8), USB test device 1 then disconnects resistors Rd (step S10). Specifically, when it is determined that power supply line VBUS has 5 V as a result of sensing by sensing unit 21, control unit 10 instructs communication control unit 20 to set line CC of connector 16 in the initial state described in FIG. 3.

When USB device (power feed device) 50 is cold socket-compatible, USB device (power feed device) 50 determines that it is not connected to a USB device (power reception device) upon detecting that plug power supply line 37 does not have the intermediate voltage as described above. Upon determining that USB device (power feed device) 50 is not being connected to a USB device (power reception device), USB device (power feed device) 50 sets power supply line VBUS to 0 V.

When USB device (power feed device) 50 is cold socket-incompatible, the determination above is not made, and power supply line VBUS is maintained at 5 V.

Next, USB test device 1 determines whether or not a prescribed period has elapsed (step S12).

USB test device 1 maintains the state of step S12 until after the prescribed period has elapsed, and when it is determined in step S12 that the prescribed period has elapsed (YES in step S12), USB test device 1 determines whether or not power supply line VBUS has 0 V (step S14). Specifically, control unit 10 determines whether or not the voltage of power supply line VBUS is 0 V as a result of sensing by sensing unit 21. By way of example, the prescribed period can be set to 650 ms.

When it is determined in step S14 that power supply line VBUS has 0 V, USB test device 1 indicates that USB device (power feed device) 50 is cold socket-compatible (step S16). Specifically, when it is determined that power supply line VBUS has 0 V as a result of sensing by sensing unit 21, control unit 10 instructs display unit 12 to indicate that USB device (power feed device) 50 is cold socket-compatible.

When it is determined in step S14 that power supply line VBUS has 5 V, USB test device 1 indicates that USB device (power feed device) 50 is cold socket-incompatible (step S18). Specifically, when it is determined that power supply line VBUS does not have 0 V as a result of sensing by sensing unit 21, control unit 10 instructs display unit 12 to indicate that USB device (power feed device) 50 is cold socket-incompatible.

Then, the process ends (END).

Through this process, when USB device (power feed device) 50 is cold socket-compatible, USB test device 1 can display this state to notify the user of the state.

When USB device (power feed device) 50 is cold socket-incompatible, USB test device 1 can display this state to notify the user of the state. By this cold socket compatibility test, the quality of USB device (power feed device) 50 can be easily verified.

<b2. Power Supply Test>

A power supply test is a test of checking whether or not a USB device (power feed device) can supply power requested by a USB device (power reception device).

The USB device (power feed device), when connected to the USB device (power reception device), transmits a power supply list storing information about electric power that can be supplied by the USB device (power feed device). The USB device (power reception device) issues a request to the USB device (power feed device) for necessary power from the power supply list.

The USB device (power feed device) supplies power in accordance with the request from the USB device (power reception device) to power supply line VBUS.

USB test device 1 checks, by the power supply test, whether or not the power of the power information stored in the power supply list is appropriately supplied from USB device (power feed device) 50. The power supply list stores information (power supply information) about a plurality of combinations of electric power that can be supplied from USB device (power feed device) 50.

By this power supply test, the quality of USB device (power feed device) 50 can be easily verified.

Figure 6:
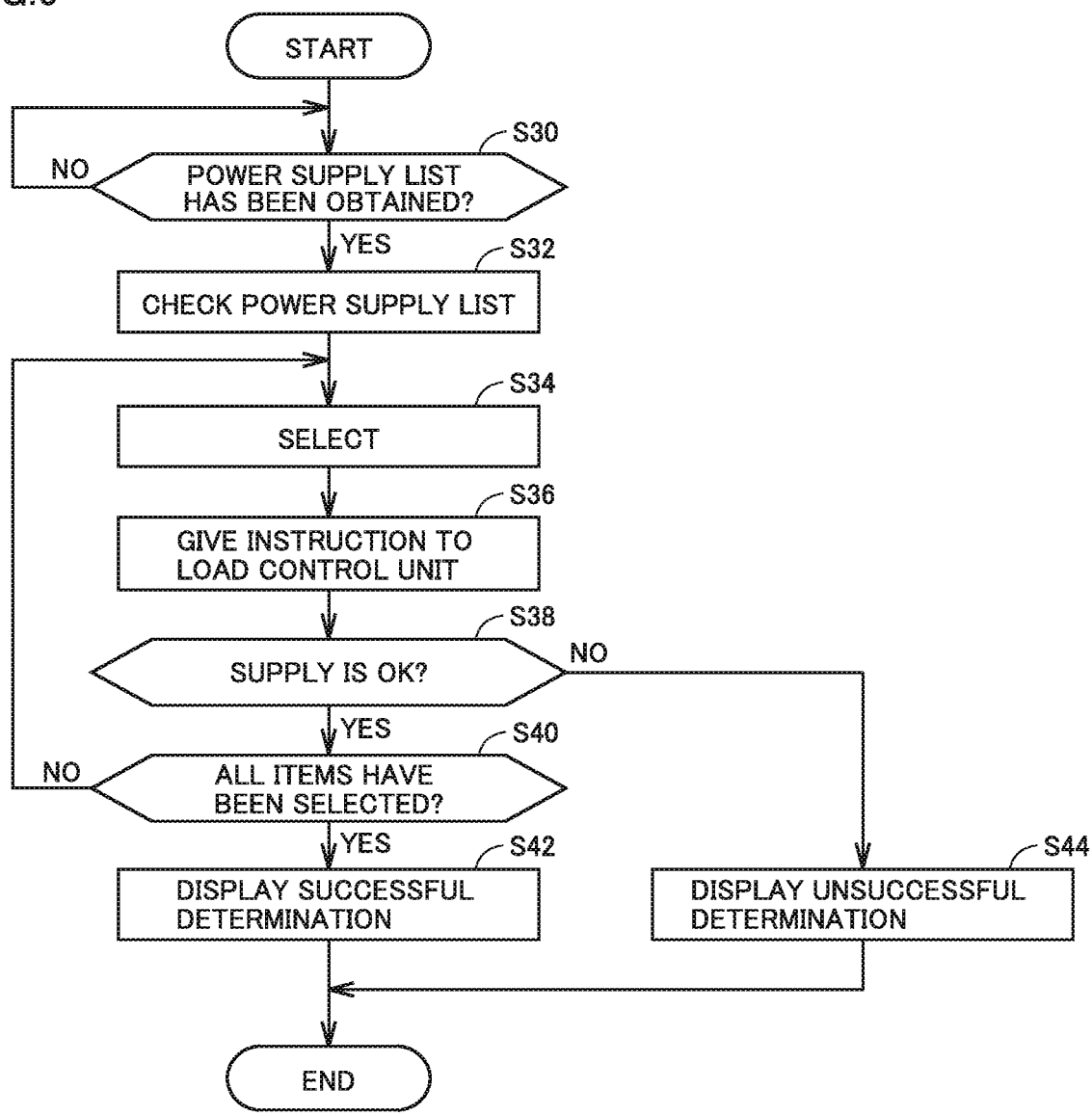
FIG. 6 is a flow diagram illustrating a power supply test of USB test device 1 based on the first embodiment.

FIG. 6 is a flow diagram illustrating the power supply test of USB test device 1 based on the first embodiment.

Referring to FIG. 6, control unit 10 determines whether or not the power supply list has been obtained (step S30). Specifically, communication control unit 20 obtains the power supply list from a communication control unit (not shown) of USB device (power feed device) 50 through line CC. Communication control unit 20 outputs the obtained power supply list to control unit 10.

When it is determined in step S30 that the power supply list has been obtained (YES in step S30), control unit 10 checks the power supply list (step S32).

FIG. 7 is a diagram illustrating the power supply list based on the first embodiment.

Referring to FIG. 7, four possible patterns of power supply are shown as the power supply list.

Specifically, 20 V and 5 A are set in association with an identification number ID0. That is, it is indicated that power of 100 W can be supplied. In addition, 15 V and 5 A are set in association with an identification number ID1. That is, it is indicated that power of 75 W can be supplied.

In addition, 10 V and 3 A are set in association with an identification number ID2. That is, it is indicated that power of 30 W can be supplied.

In addition, 5 V and 3 A are set in association with an identification number ID3. That is, it is indicated that power of 15 W can be supplied.

Referring again to FIG. 6, control unit 10 makes a selection from the power supply list (step S34). Specifically, control unit 10 notifies communication control unit 20 of an identification number ID selected from the power supply list. Communication control unit 20 transmits the selected identification number ID to USB device (power feed device) 50 connected to connector 16 through line CC. By way of example, communication control unit 20 transmits identification number ID0 to USB device (power feed device) 50. USB device (power feed device) 50 thus connects a power supply, which can pass a voltage of 20 V and a current of 5 A through power supply line VBUS, to power supply line VBUS.

Next, control unit 10 gives an instruction to load control unit 24 based on the power information selected from the power supply list (step S36). Specifically, when 20 V and 5 A associated with identification number ID0 in the power supply list have been selected, control unit 10 adjusts the load such that a current of 5 A is supplied to power supply line VBUS. The load can be adjusted, by way of example, by adjustment of a resistance value of a resistive element connected to power supply line VBUS.

Next, control unit 10 determines whether or not the power supply from USB device (power feed device) 50 is OK (step S38). Specifically, sensing unit 21 senses a voltage and a current supplied to power supply line VBUS, and outputs a result of sensing to control unit 10. Control unit 10 determines, based on the result of sensing output from sensing unit 21, whether or not the power is being appropriately supplied from USB device (power feed device) 50.

When it is determined in step S38 that the power supply is OK (YES in step S38), control unit 10 determines whether or not all of the items in the power supply list have been selected (step S40).

When it is determined in step S40 that all of the items in the power supply list have not been selected (NO in step S40), control unit 10 returns to step S34.

In step S34, control unit 10 selects an unselected item from the power supply list. Then, control unit 10 notifies communication control unit 20 of the selected identification number ID. Communication control unit 20 transmits the selected identification number ID to USB device (power feed device) 50 connected to connector 16 through line CC. By way of example, communication control unit 20 transmits identification number ID1 to USB device (power feed device) 50. USB device (power feed device) 50 thus connects a power supply, which can pass a voltage of 15 V and a current of 3 A through power supply line VBUS, to power supply line VBUS.

When 15 V and 3 A associated with identification number ID1 in the power supply list have been selected, control unit 10 adjusts the load such that a current of 3 A is supplied to power supply line VBUS.

Then, control unit 10 determines whether or not the power supply is OK.

This process is performed on all of the items in the power supply list.

When it is determined in step S40 that all of the items in the power supply list have been selected (YES in step S40), control unit 10 instructs display unit 12 to display a successful determination (step S42). Display unit 12 indicates that the power supply from USB device (power feed device) 50 is successful.

Then, the process ends (END).

When it is determined in step S38 that the power supply is not OK (NO in step S38), control unit 10 instructs display unit 12 to display an unsuccessful determination (step S44). Display unit 12 indicates that the power supply from USB device (power feed device) 50 is not successful (is unsuccessful).

Then, the process ends (END).

Through this process, USB test device 1 can check, by the power supply test, whether or not the power of the power information stored in the power supply list is appropriately supplied from USB device (power feed device) 50. By this power supply test, the quality of USB device (power feed device) 50 can be easily verified.

Although this example describes displaying a successful or unsuccessful determination of USB device (power feed device) 50 on display unit 12, this is not particularly limiting, and it may be specifically indicated by data which one of the power supply tests is unsuccessful.

Although this example describes an examination scheme of determining whether or not the power supply has been appropriately changed based on the power supply list, this is not limiting, and a successful or unsuccessful determination may be made by examining a transition state of the power supply change as well, for example.

Second Embodiment

<a3. Overview of Test of USB Test Device 1>

Figure 8:
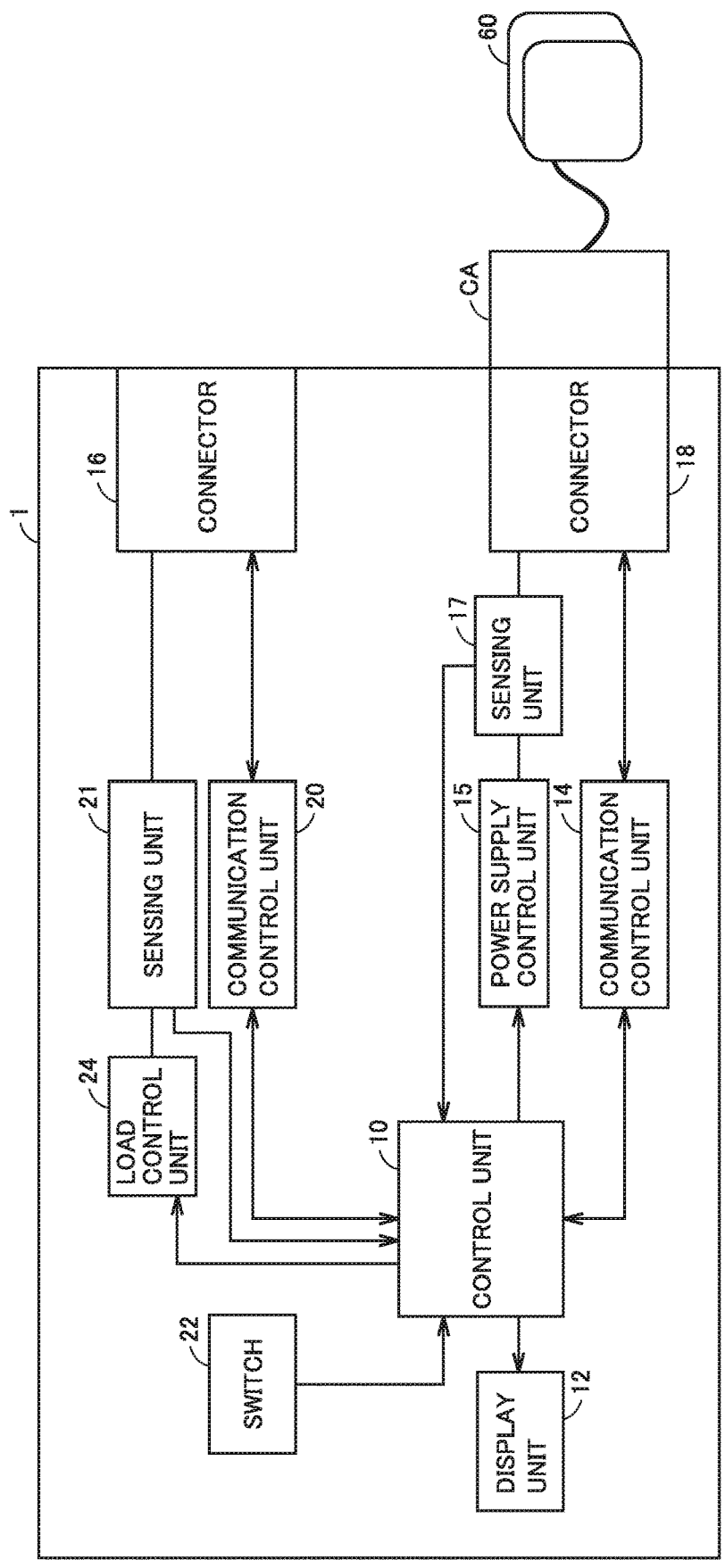
FIG. 8 is a diagram illustrating a configuration of a USB device connected to USB test device 1 based on a second embodiment.

FIG. 8 is a diagram illustrating a configuration of a USB device connected to USB test device 1 based on a second embodiment.

Referring to FIG. 8, USB test device 1 and a USB device (power reception device) 60 are shown as connected. Specifically, USB device (power reception device) 60 has a USB plug CA. USB plug CA of USB device (power reception device) 60 is inserted into and connected to connector 18.

USB device (power reception device) 60 operates with power supply received from USB test device 1. USB test device 1 has the function of USBPD (USB Power Delivery) capable of feeding power at a high voltage, and is provided to be able to feed various types of power in response to requests from the power reception side.

<b3. Power Reception Test>

A power reception test is a test of checking, when USB device (power reception device) 60 issues a power request to USB test device 1 which is a USB device (power feed device), whether or not the power is appropriately received on the USB device (power reception device) 60 side.

USB test device 1, when connected to USB device (power reception device) 60, transmits a power supply list storing information about electric power that can be supplied by USB test device 1. USB device (power reception device) 60 issues a request to USB test device 1 for necessary power from the power supply list.

USB test device 1 supplies power in accordance with the request from USB device (power reception device) 60 to power supply line VBUS.

By the power reception test, USB test device 1 receives the power request from USB device (power reception device) 60, and connects a power supply, which supplies power corresponding to the request, to power supply line VBUS.

In this state, it is checked whether or not USB device (power reception device) 60 appropriately receives the power as requested.

By this power reception test, the quality of USB device (power reception device) 60 can be verified.

Figure 9:
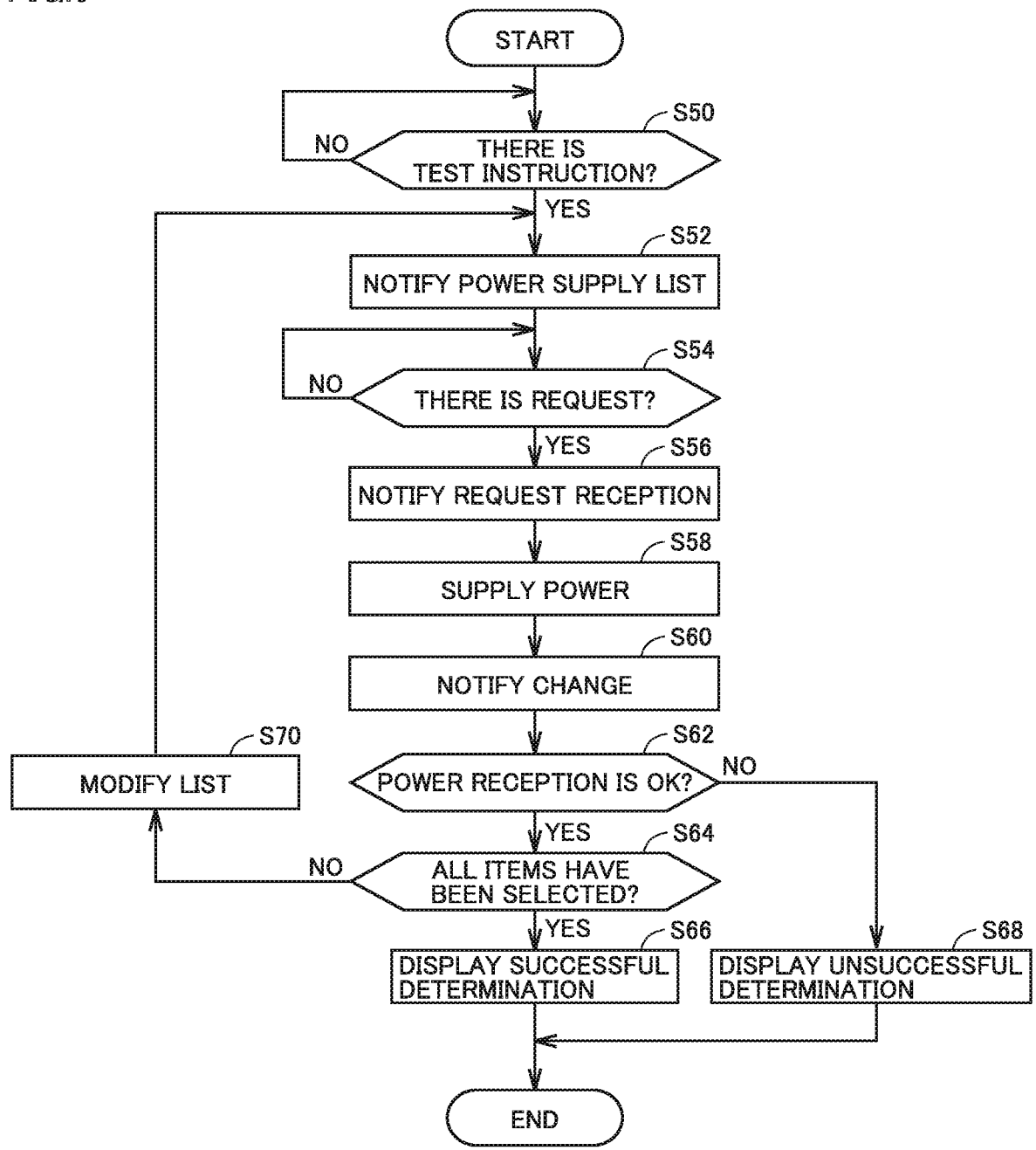
FIG. 9 is a flow diagram illustrating a power reception test of USB test device 1 based on the second embodiment.

FIG. 9 is a flow diagram illustrating the power reception test of USB test device 1 based on the second embodiment.

Referring to FIG. 9, control unit 10 determines whether or not there is a test instruction (step S50).

Control unit 10 waits for a test instruction in step S50 (NO in step S50), and when it is determined that there is a test instruction (YES in step S50), control unit 10 gives a power supply list notification (step S52). Specifically, control unit 10 notifies communication control unit 20 of the power supply list. Communication control unit 20 transmits the power supply list to USB device (power reception device) 60.

Next, control unit 10 determines whether or not there is a request (step S54). Specifically, communication control unit 20 determines whether or not a request for power from the power supply list has been received from USB device (power reception device) 60. When the request has been received from USB device (power reception device) 60, communication control unit 20 gives a notification to control unit 10.

When it is determined in step S54 that there is a request (YES in step S54), control unit 10 then gives a request reception notification (step S56).

Specifically, when there is a request to communication control unit 20, control unit 10 gives an instruction to notify USB device (power reception device) 60 that the request has been received.

Next, control unit 10 supplies power (step S58). Specifically, control unit 10 instructs power supply control unit 15 to supply the requested power. Power supply control unit 15 thus connects a power supply necessary for supplying the requested power to power supply line VBUS.

Next, control unit 10 gives a notification that the power supply connection has been changed (step S60). Specifically, control unit 10 instructs communication control unit 20 to notify USB device (power reception device) 60 that the power supply connection has been changed. By receiving this information, USB device (power reception device) 60 recognizes that the necessary power supply is possible through power supply line VBUS. Then, USB device (power reception device) 60 connects power supply line VBUS and the load.

Next, control unit 10 determines whether or not the power reception is OK (step S62). Specifically, sensing unit 17 senses a voltage and a current of power supply line VBUS, and outputs a result of sensing to control unit 10. Control unit 10 determines, based on the result of sensing output from sensing unit 17, whether or not the power is being appropriately received for USB device (power reception device) 60.

When it is determined in step S62 that the power reception is OK (YES in step S62), control unit 10 determines whether or not all of the items in the power supply list have been selected (step S64).

When it is determined in step S64 that all of the items in the power supply list have not been selected, control unit 10 modifies the power supply list (step S70), then returns to step S52.

In step S52, control unit 10 notifies communication control unit 20 of the modified power supply list. Communication control unit 20 transmits this power supply list to USB device (power reception device) 60. Next, control unit 10 determines whether or not there is a request from USB device (power reception device) 60. When it is determined that there is a request, control unit 10 gives a request reception notification, and instructs power supply control unit 15 to supply the requested power. Power supply control unit 15 thus connects the requested, necessary power supply to power supply line VBUS. Then, control unit 10 notifies USB device (power reception device) 60 that the power supply connection has been changed, determines whether or not the power reception is OK, and repeats this process.

When it is determined in step S64 that all of the items in the power supply list have been selected (YES in step S64), control unit 10 instructs display unit 12 to display a successful determination (step S66). Display unit 12 indicates that the power reception by USB device (power reception device) 60 is successful.

Then, the process ends (END).

When it is determined in step S62 that the power reception is not OK (NO in step S62), control unit 10 instructs display unit 12 to display an unsuccessful determination (step S68). Display unit 12 indicates that the power reception by USB device (power reception device) 60 is not successful (is unsuccessful).

Then, the process ends (END).

FIGS. 10A to 10D are diagrams illustrating power supply lists based on the second embodiment.

As shown in FIG. 10A, four possible patterns of power supply are listed.

Specifically, 20 V and 5 A are set in association with an identification number ID0. That is, it is indicated that power of 100 W can be supplied.

In addition, 15 V and 5 A are set in association with an identification number ID1. That is, it is indicated that power of 75 W can be supplied.

In addition, 10 V and 3 A are set in association with an identification number ID2. That is, it is indicated that power of 30 W can be supplied.

In addition, 5 V and 3 A are set in association with an identification number ID3. That is, it is indicated that power of 15 W can be supplied.

By way of example, it is assumed that an item corresponding to identification number ID0 is first selected.

Next, as shown in FIG. 10B, three possible patterns of power supply as modified are listed.

Specifically, possible patterns of power supply corresponding to identification numbers ID1 to ID3 except for identification number ID0 are shown.

By way of example, it is assumed that an item corresponding to identification number ID1 is selected next.

Next, as shown in FIG. 10C, two possible patterns of power supply as modified are listed.

Specifically, possible patterns of power supply corresponding to identification numbers ID2 and ID3 except for identification number ID1 are shown.

By way of example, it is assumed that an item corresponding to identification number ID2 is selected next.

Next, as shown in FIG. 10D, one possible pattern of power supply as modified is listed.

Specifically, a possible pattern of power supply corresponding to identification number ID3 except for identification number ID2 is shown.

When control unit 10 determines that the reception of power of the one pattern as modified in the power supply list is OK, control unit 10 determines that all of the items in the power supply list have been selected.

Then, control unit 10 instructs display unit 12 to display a successful determination.

When the power reception by the power supply indicated in the power supply list is not performed at USB device (power reception device) 60, control unit 10 instructs display unit 12 to display an unsuccessful determination.

By this power reception test, it can be checked, when USB device (power reception device) 60 issues a power request to USB test device 1, whether or not the power is appropriately received on the USB device (power reception device) side.

The quality of the USB device (power reception device) can thus be easily verified.

(Variation)

Figure 11:
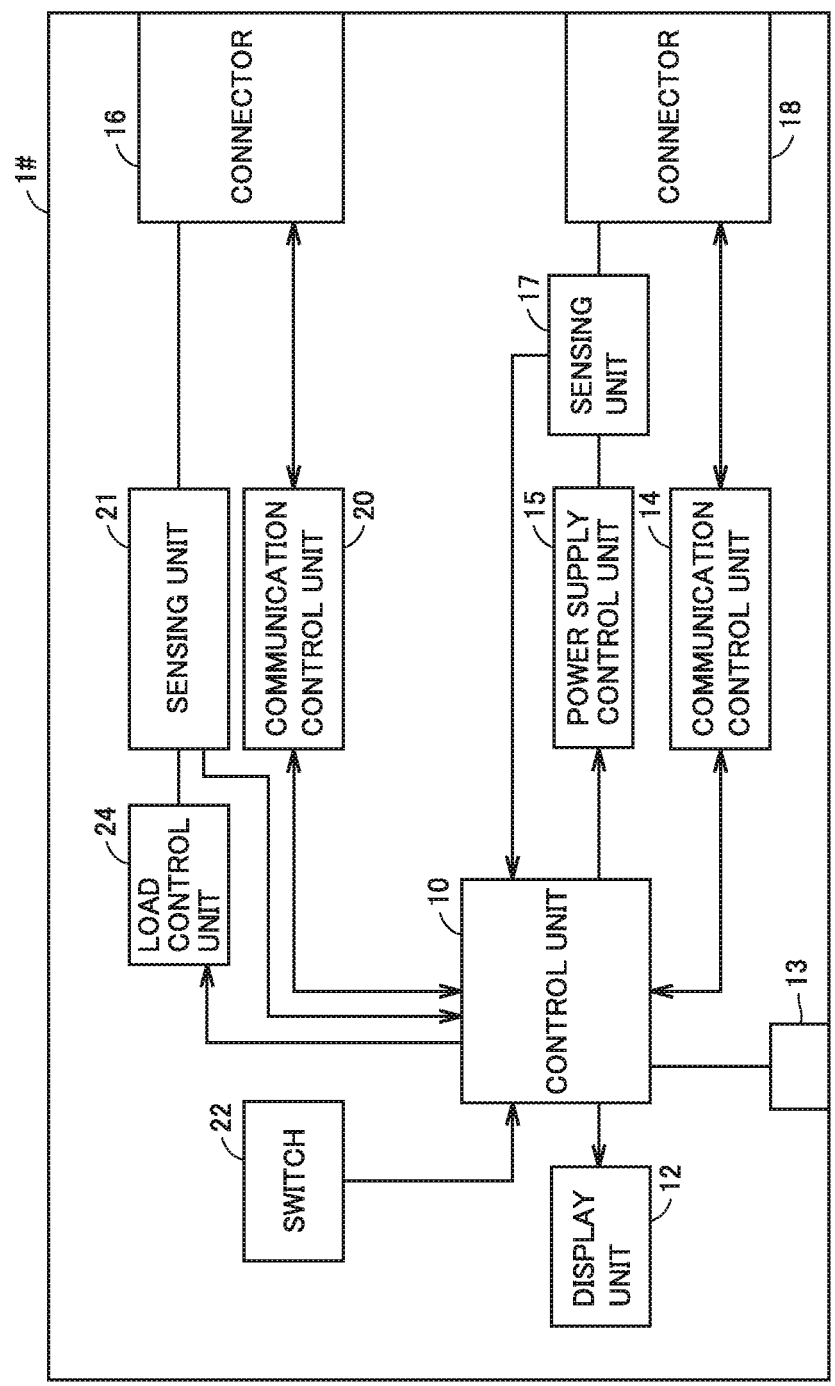
FIG. 11 is a diagram illustrating a configuration of a USB test device 1# based on a variation of the second embodiment.

FIG. 11 is a diagram illustrating a configuration of a USB test device 1# based on a variation of the second embodiment.

Referring to FIG. 11, USB test device 1# differs from USB test device 1 in that it further includes an external connection terminal 13 that can be connected to an external device. Since the configuration is otherwise the same as that described for USB test device 1, detailed description thereof will not be repeated.

By providing external connection terminal 13, a test result in USB test device 1# may be output to the external device through external connection terminal 13, or USB test device 1 may be controlled by the external device through external connection terminal 13.

Third Embodiment

Figure 12:
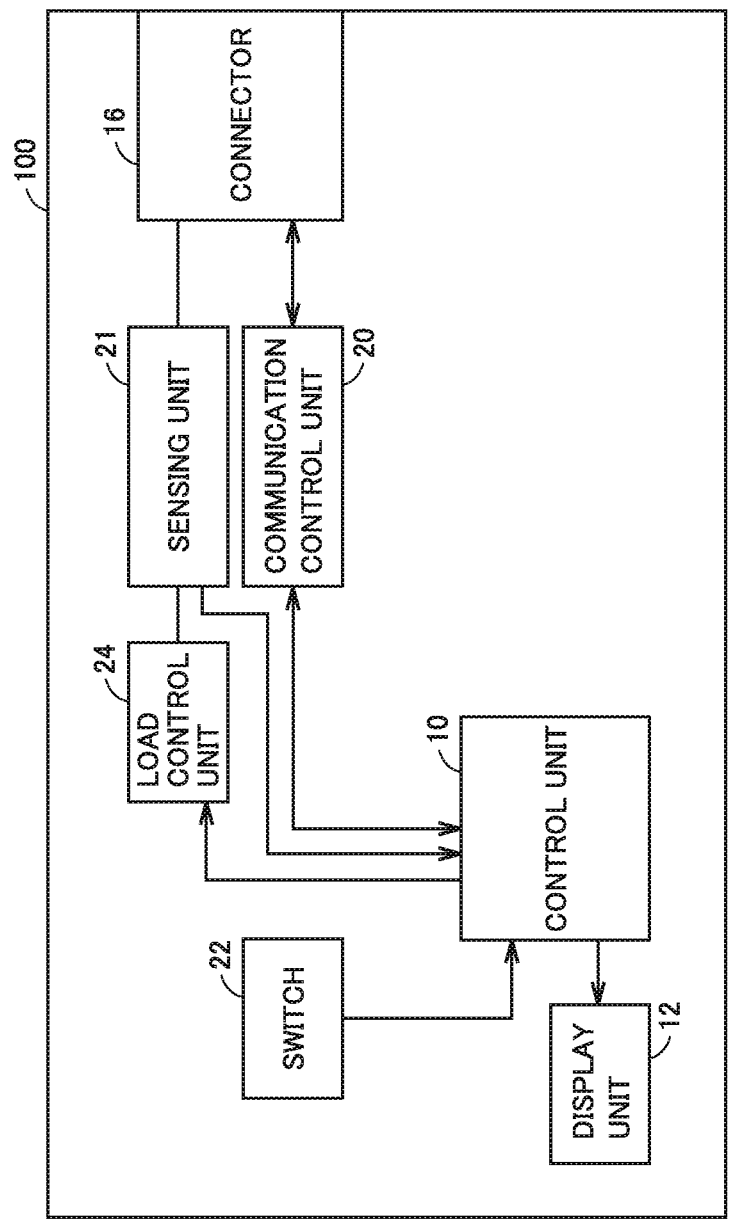
FIG. 12 is a diagram illustrating a configuration of a power reception device 100 based on a third embodiment.

FIG. 12 is a diagram illustrating a configuration of a power reception device 100 based on a third embodiment.

Referring to FIG. 12, power reception device 100 is a device having the functions of USB test device 1 described in the first embodiment.

Power reception device 100 includes connector 16 provided to be able to connect to a USB device, and communication control unit 20 provided in correspondence with connector 16. Power reception device 100 also includes load control unit 24 provided in correspondence with connector 16, sensing unit 21 that senses a voltage and a current supplied to power supply line VBUS, control unit 10 that controls the entire power reception device 100, switch 22, and display unit 12. Since the function blocks having the same symbols as those in FIG. 1 are the same as those described in the first embodiment, detailed description thereof will not be repeated.

Power reception device 100 in this example has a testing function.

Specifically, power reception device 100 is provided such that a cold socket compatibility test and a power supply test thereof can be performed.

Figure 13:
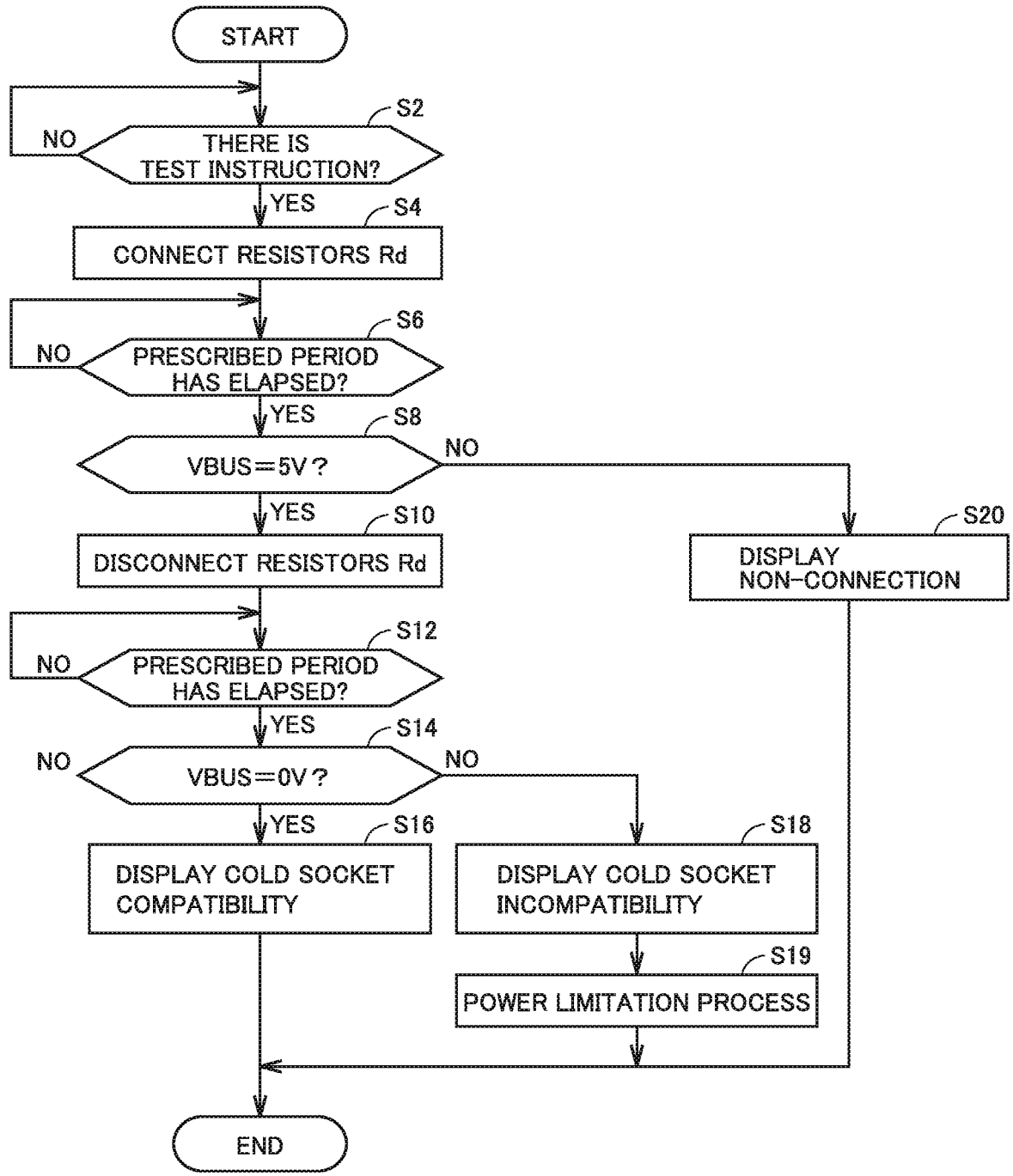
FIG. 13 is a flow diagram illustrating a cold socket compatibility test of power reception device 100 based on the third embodiment.

FIG. 13 is a flow diagram illustrating the cold socket compatibility test of power reception device 100 based on the third embodiment.

Referring to FIG. 13, this flow diagram differs from the flow diagram of FIG. 5 in that a process of step S19 is added. Since the processing is otherwise the same, detailed description thereof will not be repeated.

When it is indicated in step S18 that the USB device (power feed device) is cold socket-incompatible, control unit 10 performs a power limitation process (step S19).

Specifically, control unit 10 limits the power such that it receives supply of power equal to or smaller than prescribed power from the USB device (power feed device). Specifically, control unit 10 instructs the USB device (power feed device) through communication control unit 20 to limit the power such that power equal to or greater than a voltage of 5 V and a current of 3 A is not supplied to power supply line VBUS from the USB device (power feed device). Control unit 10 may request the lowest power in the power supply list.

When the USB device (power feed device) is cold socket-compatible, a normal process is performed without this power limitation process being performed.

With this configuration, when power reception device 100 is connected to a cold socket-incompatible USB device (power feed device), the power limitation process can be performed to suppress an overload on the USB device (power feed device), burning due to or heated equipment and the like, thus allowing for use with safety in mind.

Although this example has described performing the process of step S19 subsequent to step S18, this configuration is not particularly limiting, and the process may be performed prior to step S18. Further, when the user can check safety, the power limitation process may be canceled.

Figure 14:
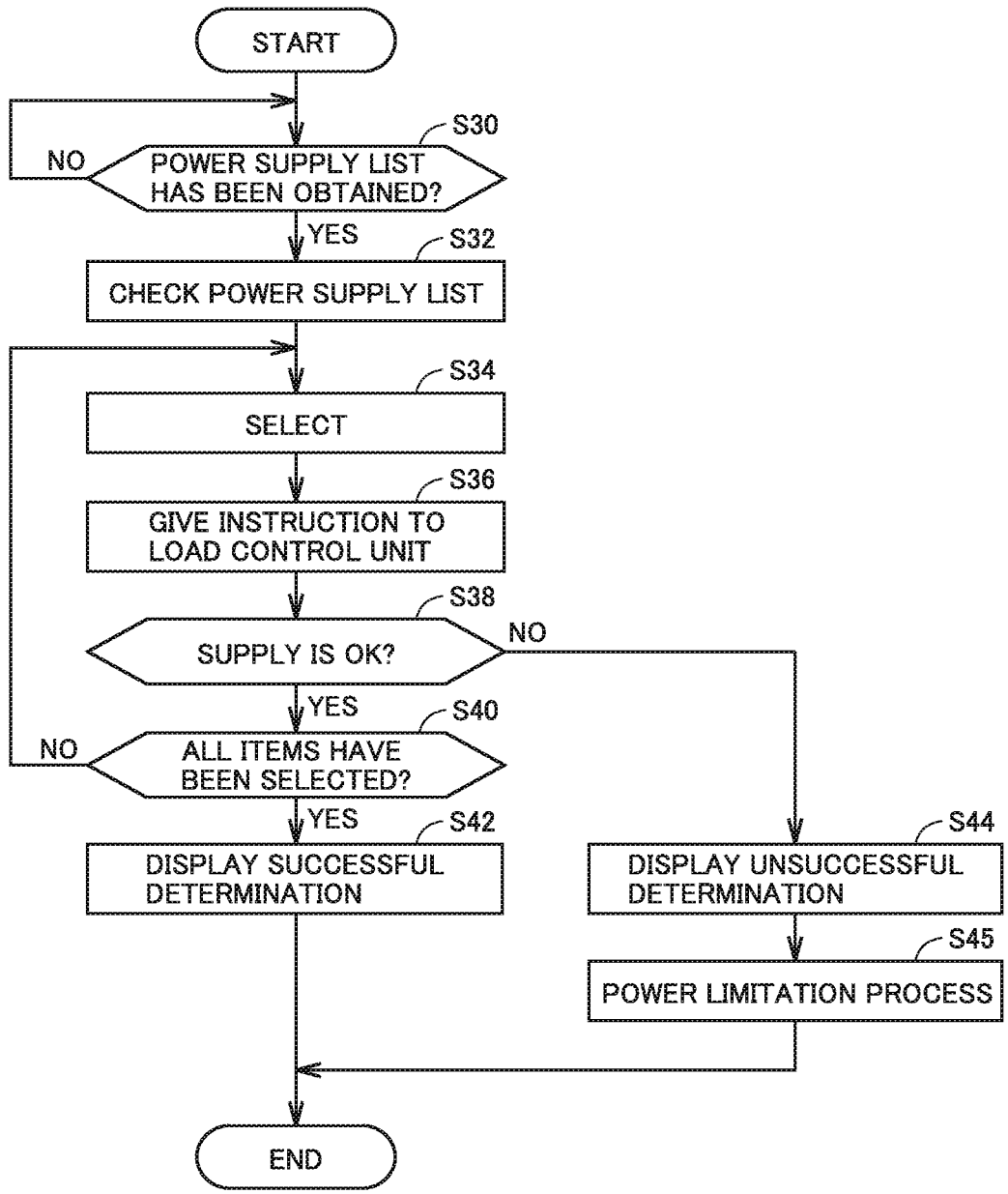
FIG. 14 is a flow diagram illustrating a power supply test of power reception device 100 based on the third embodiment.

FIG. 14 is a flow diagram illustrating the power supply test of power reception device 100 based on the third embodiment.

Referring to FIG. 14, this flow diagram differs from the flow diagram of FIG. 6 in that a process of step S45 is added. Since the processing is otherwise the same, detailed description thereof will not be repeated.

When an unsuccessful determination is displayed in step S44, control unit 10 performs the power limitation process (step S45).

Specifically, control unit 10 limits the power such that it receives supply of power equal to or smaller than prescribed power from the USB device (power feed device). Specifically, control unit 10 instructs the USB device (power feed device) through communication control unit 20 to limit the power such that power equal to or greater than a voltage of 5 V and a current of 3 A is not supplied to power supply line VBUS from the USB device (power feed device). Control unit 10 may request the lowest power in the power supply list.

In the case of a successful determination, a normal process is performed without this power limitation process being performed.

With this configuration, when power reception device 100 is connected to a USB device (power feed device) determined to be unsuccessful, the power limitation process can be performed to suppress an overload on the USB device (power feed device), burning due to or heated equipment and the like, thus allowing for use with safety in mind.

Although this example has described performing the process of step S45 subsequent to step S44, this configuration is not particularly limiting, and the process may be performed prior to step S44. Further, when the user can check safety, the power limitation process may be canceled.

By having this easy testing function, a power reception device that can be safely connected to a USB device (power feed device) can be realized.

<Other Forms>

USB test device 1 may examine a USB device (power feed device) or a USB device (power reception device) through a USB cable. A failure caused by this USB cable can also be determined, to verify the quality of the USB cable.

Although the embodiments of the present invention have been described, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A USB (Universal Serial Bus) test device for testing a power feed device having a USB plug, the USB test device comprising:
    a connector connected to the USB plug;
    a communication control unit that communicates with the power feed device through a communication line of the connector;
    a load control unit controlling a load of a power supply line of the connector receiving power supply from the power feed device;
    a test control unit that gives an instruction to the load control unit based on power supply information, the power supply information includes a combination of electric power that can be supplied from the power feed device, the power supply information being obtained by the communication control unit, and the test control unit examines a state of power supply to the load from the power feed device according to the power supply information; and
    a display unit that displays a result of examination by the test control unit.

2. The USB test device according to claim 1, wherein
    the power supply information includes a plurality of power lists storing a plurality of combinations of electric power and accessible by the test control unit for examining whether the power of the power information stored in the power supply list is appropriately supplied from the power feed device to the load, and
    the test control unit instructs the load control unit that voltages and currents indicated in all of the plurality of power lists be supplied to the load from the power feed device.

3. The USB test device according to claim 2, wherein
    the test control unit determines whether voltages and currents indicated in all of the plurality of power lists are supplied to the load from the power feed device, and
    when it is determined that voltages and currents indicated in all of the plurality of power lists are supplied to the load, the display unit indicates that the result of examination is successful, and
    wherein the plurality of combinations of electric power includes combinations of voltages and currents stored in the power lists.

4. The USB test device according to claim 2, wherein
    the test control unit determines whether voltages and currents indicated in all of the plurality of power lists are supplied to the load from the power feed device, and
    when it is determined that a voltage and a current indicated in at least one of the plurality of power lists are not supplied to the load, the display unit indicates that the result of examination is unsuccessful.

5. The USB test device according to claim 1, further comprising a switch that indicates execution of test operation, wherein
    the communication control unit communicates with the power feed device in accordance with the indication from the switch, and
    wherein when test instructions are received, the test control unit gives the instruction to the load control unit based on the power supply information which was obtained by the communication control unit and which is about the combination of electric power that can be supplied from the power feed device, and examines the state of power supply to the load from the power feed device.

6. The USB test device according to claim 1, wherein the test control unit is configured to:
    determine whether the voltage of the power supply line is set to a certain state after instructing the connection unit to connect or disconnect the signal line of the connector and a resistor,
    based on a result of the determination, issues a request for prescribed power to the power feed device through the communication control unit.

7. The USB test device according to claim 1, wherein based on a result of a determination of a state of the voltage of the power supply line, the test control unit issues a request for prescribed power to the power feed device through the communication control unit, and
    wherein the test control unit determines whether the voltage of the power supply line is set to a certain state after instructing the connection unit to connect or disconnect the signal line of the connector.

8. A USB (Universal Serial Bus) test device comprising:
    a connector connected to a USB plug;
    a communication control unit that communicates with a separate power feed device through a communication line of the connector;
    a load control unit controlling a load of a power supply line of the connector receiving power supply from the power feed device; and
    a test control unit that gives an instruction to the load control unit based on power supply information, the power supply information includes a combination of electric power that can be supplied from the power feed device, the power supply information being obtained by the communication control unit, and the test control unit examines a state of power supply to the load from the power feed device according to the power supply information to output a result of the examination by the test control unit.

9. The USB test device according to claim 8, wherein
    the power supply information includes a plurality of power lists storing a plurality of combinations of electric power and accessible by the test control unit for examining whether the power of the power information stored in the power supply list is appropriately supplied from the power feed device to the load, and
    the test control unit instructs the load control unit that voltages and currents indicated in all of the plurality of power lists be supplied to the load from the power feed device.

10. The USB test device according to claim 8, wherein
    the test control unit determines whether voltages and currents indicated in all of a plurality of power lists are supplied to the load from the power feed device, and when it is determined that voltages and currents indicated in all of the plurality of power lists are supplied to the load, the display unit indicates that the result of examination is successful.

11. The USB test device according to claim 8, wherein
the test control unit determines whether voltages and currents indicated in all of a plurality of power lists are supplied to the load from the power feed device, and
when it is determined that a voltage and a current indicated in at least one of the plurality of power lists are not supplied to the load, the display unit indicates that the result of examination is unsuccessful.

12. The USB test device according to claim 8, further comprising a switch that indicates execution of test operation, wherein
the communication control unit communicates with the power feed device in accordance with the indication from the switch.

13. The USB (Universal Serial Bus) test device according to claim 8, wherein the separate power feed device is included in a host device,
wherein the power supply information includes a plurality of power lists storing a plurality of combinations of electric power and accessible by the test control unit, and
wherein a plurality of combinations of electric power includes combinations of voltages and currents stored in the power lists.

14. A USB (Universal Serial Bus) test device comprising:
a connector connected to a USB plug of a power fee device;
a load control unit controlling a load of a power supply line of the connector receiving power supply from the power feed device; and
a test control unit that gives an instruction to the load control unit based on power supply information, the power supply information includes a combination of electric power that can be supplied from the power feed device, and examines a state of power supply to the load from the power feed device according to the power supply information to output a result of the examination by the test control unit.

15. The USB test device according to claim 14, wherein
the power supply information includes a plurality of power lists storing a plurality of combinations of electric power and accessible by the test control unit for examining whether the power of the power information stored in the power supply list is appropriately supplied from the power feed device to the load, and
the test control unit instructs the load control unit that voltages and currents indicated in all of the plurality of power lists be supplied to the load from the power feed device.

16. The USB test device according to claim 14, wherein
the test control unit determines whether voltages and currents indicated in all of a plurality of power lists are supplied to the load from the power feed device, and
when it is determined that voltages and currents indicated in all of the plurality of power lists are supplied to the load, the display unit indicates that the result of examination is successful.

17. The USB test device according to claim 14, wherein
the test control unit determines whether voltages and currents indicated in all of a plurality of power lists are supplied to the load from the power feed device, and
when it is determined that a voltage and a current indicated in at least one of the plurality of power lists are not supplied to the load, the display unit indicates that the result of examination is unsuccessful.

18. The USB test device according to claim 14, further comprising a switch that indicates execution of test operation, wherein
the communication control unit communicates with the power feed device in accordance with the indication from the switch.

19. The USB (Universal Serial Bus) test device according to claim 14, wherein the separate power feed device is included in a host device,
wherein the power supply information includes a plurality of power lists storing a plurality of combinations of electric power and accessible by the test control unit, and
wherein a plurality of combinations of electric power includes combinations of voltages and currents stored in the power lists.

20. The USB test device according to claim 14, wherein the test control unit is configured to:
determine whether the voltage of the power supply line is set to a first state after instructing the connection unit to connect the signal line of the connector and a resistor,
determine whether the voltage of the power supply line is set to a second state after instructing the connection unit to disconnect the signal line of the connector and the resistor, and
based on a result of determination, issues a request for prescribed power to the power feed device through the communication control unit.

* * * * *